United States Patent
Ha et al.

(10) Patent No.: US 8,207,877 B2
(45) Date of Patent: Jun. 26, 2012

(54) SERIAL INTERFACE, APPARATUS INCLUDING THE SAME, AND METHOD OF USING THE SAME

(75) Inventors: Chang Woo Ha, Seongnam-si (KR); Sung Hoon Bea, Seoul (KR); Sang Heum Yeon, Pyeongtaek-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 152 days.

(21) Appl. No.: 12/765,819

(22) Filed: Apr. 22, 2010

(65) Prior Publication Data

US 2010/0271251 A1    Oct. 28, 2010

(30) Foreign Application Priority Data

Apr. 22, 2009 (KR) .................. 10-2009-0035028

(51) Int. Cl.
   *H03M 5/08* (2006.01)
(52) U.S. Cl. ......................................... 341/53; 341/100
(58) Field of Classification Search .................. 341/53, 341/100, 101; 375/238, 239
See application file for complete search history.

(56) References Cited

U.S. PATENT DOCUMENTS

| 4,146,743 | A | * | 3/1979 | Raynham ................... 341/53 |
| 5,315,299 | A | * | 5/1994 | Matsumoto ................ 341/53 |
| 5,374,927 | A | * | 12/1994 | MacTaggart et al. ........ 341/53 |
| 5,615,228 | A | * | 3/1997 | Soenen ..................... 375/238 |
| 7,551,669 | B2 | * | 6/2009 | Dicky ...................... 375/238 |
| 7,701,367 | B2 | * | 4/2010 | Sang et al. ................ 341/53 |

FOREIGN PATENT DOCUMENTS

JP  2008-300052 A  12/2008

OTHER PUBLICATIONS

Akio Iwao; "Discharge Lamp Lighting Device, and Image Projecting Device"; Patent Abstracts of Japan; Publication No. 2008-300052; Publication Date: Dec. 11, 2008; Japan Patent Office, Japan.

* cited by examiner

*Primary Examiner* — Howard Williams
(74) *Attorney, Agent, or Firm* — The Law Offices of Andrew D. Fortney; Andrew D. Fortney; Ryan S. Dunning

(57) ABSTRACT

An apparatus for transferring serial data (e.g., a serial interface using a single wire) generally includes a detector configured to detect a first level time period and a second level time period of an input signal, and a computing unit configured to compute a duty or duty cycle of the input signal and generate an output signal based on the duty or duty cycle.

19 Claims, 2 Drawing Sheets

SERIAL INTERFACE, APPARATUS INCLUDING THE SAME, AND METHOD OF USING THE SAME

CROSS REFERENCE TO RELATED APPLICATION

This application claims the benefit of the Patent Korean Application No. 10-2009-0035028, filed on Apr. 22, 2009, which is hereby incorporated by reference as if fully set forth herein.

BACKGROUND OF THE DISCLOSURE

1. Field of the Disclosure

The present invention relates to a serial interface and an apparatus and method for serial interfacing, and more particularly, to an apparatus including a serial interface and a method for serial interfacing in which data input/reception and reset functions are possible using a duty or duty cycle of an input signal.

2. Discussion of the Related Art

As mobile devices pursue size reduction, high integration, and low power consumption, the size of components used in mobile devices is being reduced, and power terminals and signal terminals are being simplified. Especially, as internal signal terminals in mobile devices such as cellular phones, PMPs, and MP3 players, instead of conventional buses, high speed Serial Interfaces are increasingly used due to their low power consumption, contribution to size reduction, high-speed capability and/or operations, and simple design.

The signal transmission method simplified as described above was typically embodied as I2C, USB, or One-Wire, presently. Especially, the One-Wire interface, having a powerful performance in making fast transmission/reception of signals among a plurality of chip components through one signal terminal, is widely used in cellular phones.

FIG. 1 illustrates a block diagram of an integrated circuit (IC) that includes a conventional single wire interface. The IC includes an input, an output, an enable/set or reset (EN/SET) input, and a core portion 10. The core portion 10 is intended to be generally representative of circuits that function to create an output signal (e.g., OUTPUT) using the input signal (e.g., INPUT) and the EN/SET input connected to a sensing circuit 20. The sensing circuit monitors the EN/SET signal at the EN/SET input and determines if that voltage is constantly high, constantly low, or toggling. Based on this determination, the sensing circuit 20 outputs two types of signals: a periodic signal or clock signal (CLOCK) and an enable signal (ENABLE). The clock signal and the enable signal control operation(s) of an N-bit counter 30. The counter 30 counts rising transitions of the clock signal whenever the sensing circuit 20 asserts the enable signal. The counter 30 is reset when the enable signal is not asserted.

As shown in FIG. 1, the counter 30 receives both the clock and enable signals. The first rising transition of the EN/SET signal raises the enable signal ENABLE and causes the EN/SET signal to be forwarded as the clock signal cycles. The counter 30 responds by increasing its value to one at the first rising edge or high logic level of the clock signal, for example. The subsequent rising transitions cause the counter 30 to increment its value to two, three and so on. The counter 30 is reset to zero when the sensing circuit 20 transitions the enable signal ENABLE to a low value. An N-bit output of the counter 30 controls a ROM 40. The ROM 40 has a total of $2^N$ words, each having M bits. Each M-bit word corresponds to one control state for the circuit. The N-bit output of the counter 30 selects a particular M-bit word within the ROM 40. The selected control state and the enable signal are passed to the core portion 10. The core portion 10 is configured to adjust its operation to match the selected control state.

However, the conventional single wire interface device employs a pulse counting technique in which as many clock cycles as data words in ROM 40 are required. For an example, 256 bits may be required to transmit "256" as a numerical data word, and thus, the efficiency of using the clock is low when the amount of data is large. When a large amount of data is transmitted, such inefficient clock use causes a problem in that transmission speed becomes slow, and power consumption increases depending on the number of times the clock signal switches.

SUMMARY OF THE DISCLOSURE

Accordingly, the present invention is directed to a serial interface, an apparatus including a serial interface, and a method for serial interfacing (e.g., transferring serial data) in which data input and reset functions are possible and/or controlled using a duty or duty cycle of an input signal.

Additional advantages, objects, and features of the disclosure will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose(s) of the invention, as embodied and broadly described herein, an apparatus for serial interfacing (or transferring serial data) generally includes a detector configured to detect (or determine) a first level time period and a second level time period of an input signal (e.g., the respective lengths of time that an input signal has a first logic level and a second, different logic level); and a computing unit configured to compute a duty or duty cycle of the input signal and generate (or provide) an output signal based on the duty or duty cycle (e.g., of the input signal). In preferred embodiments, the apparatus or interface has or consists of a single wire or a single pin.

In another aspect of the present invention, a method for serial interfacing (or transferring serial data) includes receiving an input signal having a first level and a second level; detecting or determining a period (e.g., length of time) of the first level and a period or length of time of the second level, respectively; generating a binary signal based on a ratio of the period of the first level and the period of the second level (or percentage of the period of the first level of the corresponding cycle of the incoming signal); and outputting one or more binary signals during a predetermined time period as data or a control signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle(s) of the disclosure. In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts. Configurations and operations of the present invention shown on drawings attached thereto and described with reference to the drawings are generally described as at least one of the embodiments of the present invention. However, technical aspects and essential configuration(s) and operation(s) of the present invention are not necessarily limited by the description herein.

The terms used in the present disclosure are selected from general words used widely presently as far as possible. However, in particular cases, there can be terms that were selected at the inventor's discretion or for other reasons. In those cases, because the implication of the term(s) is described in relevant parts of this detailed description, it may be required to understand the present invention, not by simple names of the terms, but by the implication(s) of the terms.

Figure 2:
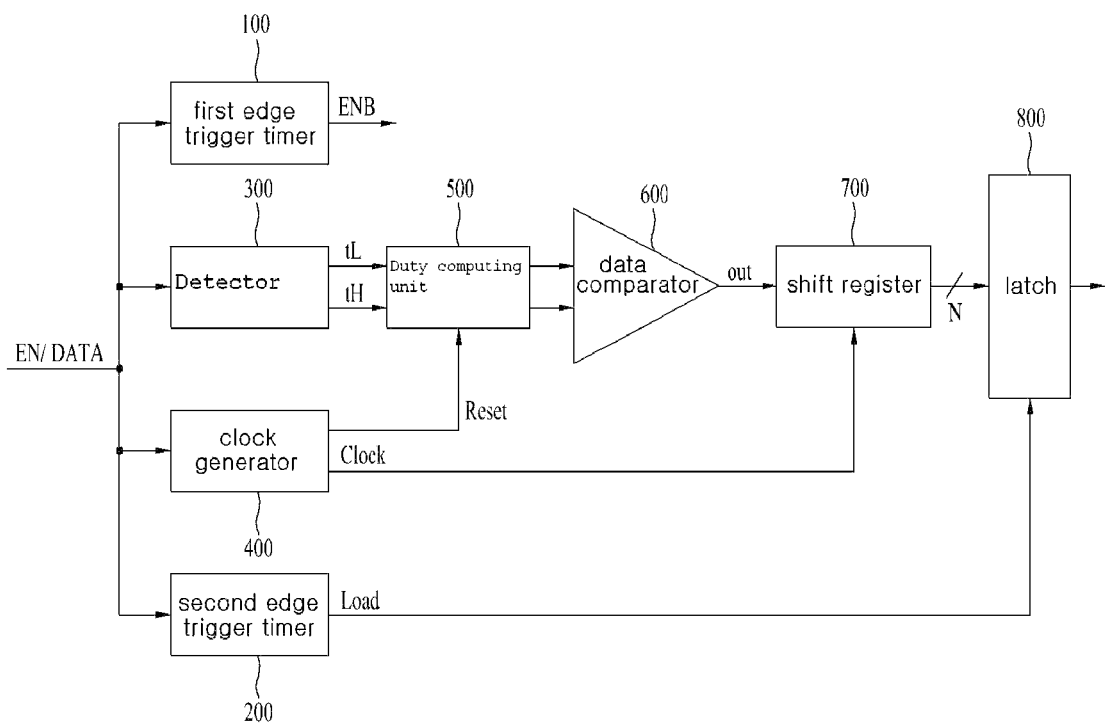
FIG. 2 illustrates a block diagram of an apparatus configured to provide (or including) a single wire serial interface in accordance with an exemplary embodiment of the present invention.
Figure 3:
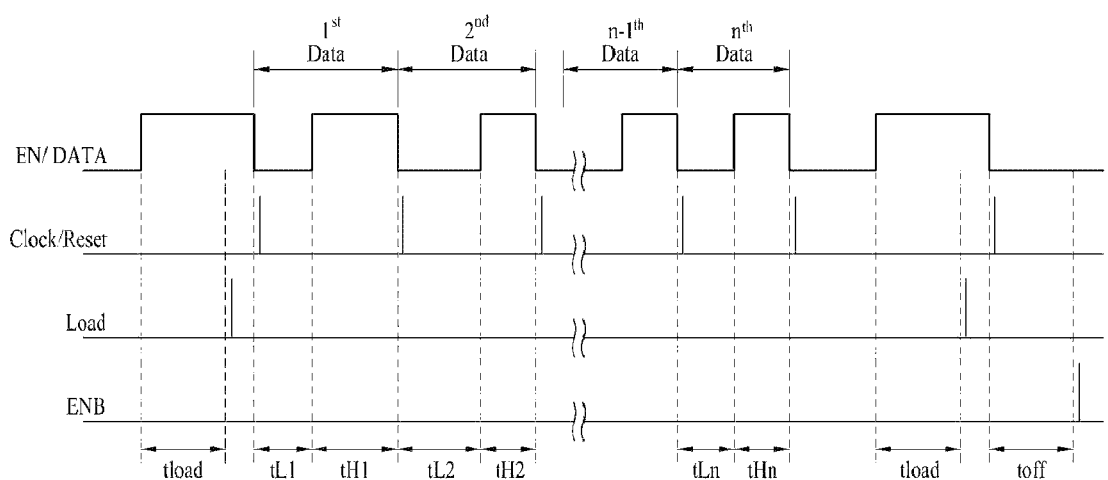
FIG. 3 illustrates a diagram of signal waveforms for explaining an operation of a single wire serial interface in accordance with an exemplary embodiment of the present invention.

An apparatus for single wire serial interfacing (or transferring serial data; e.g., a single wire serial interface) is described with reference to FIGS. 2 and 3. FIG. 2 is a block diagram illustrating an apparatus for single wire serial interfacing (or transferring serial data) in accordance with an exemplary embodiment of the present invention. FIG. 3 illustrates a diagram of signal waveforms for explaining operation(s) of the exemplary single wire serial interface in accordance with embodiments of the present disclosure.

Referring to FIG. 2, the apparatus for serial interfacing (or transferring serial data) according to an exemplary embodiment includes first and second edge triggered timers 100 and 200 and a detector 300. The first and second edge triggered timers 100 and 200 may be integrated as one component. The apparatus for serial interfacing (or transferring serial data) further includes a computing unit configured to compute and externally transmit an output to, for example, a ROM or a decoder which receives the output to output data or a control signal. The computing unit includes a clock generator 400, a duty or duty cycle computing unit 500, a data comparator 600, a shift register 700, and a latch 800.

The detector 300 detects or determines a level time period of an input signal EN/DATA, for example, a low level time period (e.g., the amount of time at which the input signal has a low binary logic level) and a high level time period (e.g., the amount of time at which the input signal has a high binary logic level).

The input signal generally has a first level signal (e.g., a low logic level) and a second level signal (e.g., a high logic level) during each cycle thereof (e.g., the period from a first rising transition of the input signal to the next successive rising transition of the input signal, or the period from a first falling transition of the input signal to the next successive falling transition of the input signal). The ratio of the first level time period to the second level time period is referred to as a duty. Alternatively, the ratio of (i) the period of the first level (e.g., a high logic level) of the input signal to (ii) the period of the corresponding cycle of the input signal (e.g., the period from a first rising edge to a next, successive rising edge) may be referred to as a duty cycle (which may also be expressed as a percentage). Here, let us assume that the first and second level signals have high and low levels (e.g., binary logic levels), respectively, or vice versa.

Figure 1:
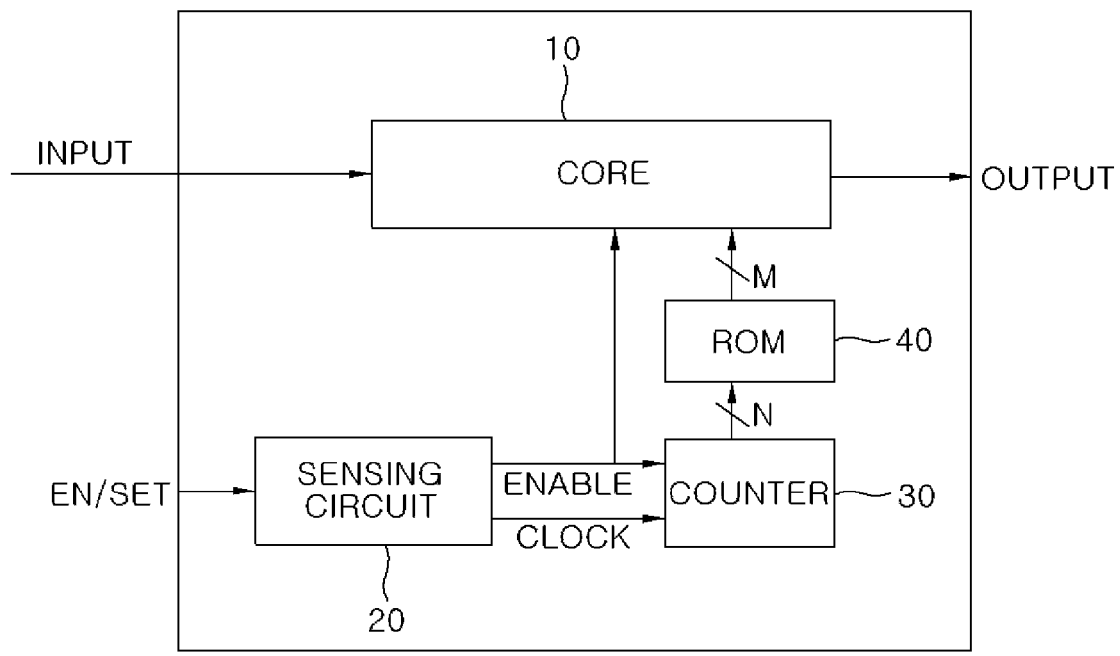
FIG. 1 illustrates a block diagram of an integrated circuit (IC) configured to provide a conventional single wire interface.

The computing unit computes the duty or duty cycle of the input signal and generates an output signal based on the duty or duty cycle of the input signal. The output signal externally transmitted from the computing unit may comprise one or more binary or binary logic signals as data or as a control signal (or a command) which is forwarded to a destination such as a core portion 10 of an electronic product as shown in FIG. 1.

The first and second edge triggered timers 100 and 200 receive the input signal and output an enable signal ENB and a load signal Load, respectively. In one variation, the first and second edge triggered timers 100 and 200 may be level (e.g., logic level)-triggered timers. For example, when the input signal has a first level (for example, a high level) during a time period "tload" or more (e.g., for at least a first time period having a first predetermined length), the second timer 200 generates and outputs the load signal. When the input signal has a second level (for example, a low level) during a time period "toff" or more (e.g., for at least a second time period having a second predetermined length) after the input signal has the first level during the time period "tload", the first timer 100 generates and outputs an off signal. That is, when transmission of input data into the apparatus/serial interface is completed, the off signal is output as a reset signal or a disable signal, which resets or disables the apparatus for serial interfacing (or transferring serial data), and the data is output from the latch 800. When the input signal has the second level even after the time period "toff" elapses, the first timer 100 generates the enable signal ENB which is output to, for example, the core portion 10 in FIG. 1.

More specifically, when the input signal EN/DATA is in a high logic state for at least the time period "tload" or longer (e.g., for at least a predetermined reference time), the second timer 200 outputs the load signal to the latch 800, so that the latch 800 receives N-bit data or digital signals from (e.g., stored in) the shift register 700.

The detector 300 (or the apparatus or serial interface as a whole) may detect a low level time period and a high level time period of the input signal (e.g., as explained herein) in units of pulses (e.g., clock cycles). For example, at every cycle of the input signal, the detector 300 detects each of the time periods $tL1, tL2, \ldots, tLn$ in which the input signal (e.g., DATA) has a low logic level or low state, and each of the time periods $tH1, tH2, \ldots, tHn$ in which the input signal has a high logic level or high state The detector 300 then forwards each low state and each high state of the input signal (e.g., as part of or along with the low state and high state time period information) to the duty (e.g., duty cycle) computing unit 500.

The clock generator 400 receives the input signal and outputs a clock signal (e.g., Clock). For example, the clock generator 400 generates the clock signal in synchronization with a falling edge of the input data signal, and forwards the clock signal to the shift register 700. Thus, in one embodiment, the clock generator 400 may comprise a clock recovery circuit, configured to recover a periodic/clock signal from an incoming data signal (which may be digital or analog, but is preferably digital). The clock signal (Clock) is output to the shift register 700, which stores an output signal (e.g., a serial output signal) from the comparator 600 in sequence.

The duty or duty cycle computing unit 500 computes the duty or duty cycle of the input signal based on the low state time periods $tL1, tL2, \ldots, tLn$ and the high state time periods $tH1, tH2, \ldots, tHn$ that correspond to the low-level incoming data signals and the high-level incoming data signals, respectively. For example, the duty computing unit 500 converts the low-level signals and the high-level signals (e.g., incoming data DATA) from the detector 300 into electrical signals such as a voltage or a current (or alternatively, a digital or analog signal) before computing the duty or duty cycle.

The data comparator 600 receives the duty or duty cycle information (e.g., as a digital or analog signal) and a reference signal, compares the duty or duty cycle information with the reference signal, and outputs a digital signal, for example, a binary signal including or consisting of zero (0) and one (1) logic level states. For example, the reference signal may be set to an analog value between zero (0) and one (1) or a digital value between an "all zeros" state and an "all ones" state. For example, the data comparator 600 may generate a binary signal of one (1) if the duty or duty cycle has a value that is less than the reference signal, or a binary signal of zero (0) if the duty or duty cycle has a value that is equal to or larger than the reference signal. For example, in the case of an analog signal from the duty computing unit 500, if the reference signal has a value of 0.5, the data comparator 600 may forward "0" as a 1-bit digital (binary) signal to the shift register 700 when the high level time period is longer than the low level time period, or vice versa.

The shift register 700 stores the binary signals, in an input order, from the data comparator 600 in synchronization with the clock signal from the clock generator 400. Namely, the shift register 700 stores one or more binary signals or N-bit data during a data transmission period and outputs one or more binary signals or N-bit data to the latch 800 in response to the clock signal from the clock generator 400.

The latch 800 configures a forwarding unit. The latch 800 is configured to load the one or more binary signals from the shift register 700 in response to the load signal, and output the one or more binary signals as data or a control signal (a command) in response to the enable signal ENB.

An operation for single wire serial interfacing (or transferring serial data using a single wire) in accordance with an exemplary embodiment of the present disclosure is explained below.

Upon reception of the input data signal, the second timer 200 determines whether or not the input data signal is in a high state for a predetermined period of time (e.g., the load time period "tload" or longer) in order to determine the beginning of data transmission. That is, if the input data signal is in a high logic state for the load time period "tload" or longer, an active load signal is output, so that the latch 800 receives the digital signals sequentially from the shift register 700.

Then, the detector 300 detects or determines each of the low state time periods $tL1, tL2, \ldots, tLn$ and each of the high state time periods $tH1, tH2, \ldots, tHn$ of the input signal at every cycle of the input signal.

Then, the duty or duty cycle computing unit 500 computes the duty or duty cycle of the input signal and outputs the duty or duty cycle to the data comparator 600.

Then, the data comparator 600 compares a digital or analog value representative of the duty or duty cycle with the reference value and generates a digital output signal (e.g., out), for example, a binary signal. In one example, if the set reference value is 0.5, the data comparator 600 forwards, to the shift register 700, a "0" bit if the duty or duty cycle value is equal to or higher than 0.5 or a "1" bit if the duty or duty cycle value is lower than 0.5.

As described above, the single wire serial interface, apparatus including the same, and method for single wire serial interfacing (or transferring serial data using a single wire interface) have the following advantages.

The clock use efficiency is excellent. For example, while 256 bits are required to transmit "256" as a numerical data in the conventional art, the present apparatus and method requires only an 8-bit signal (i.e., $256=2^8$) since it is obtained by comparing 8 duties or duty cycles for transmission of "256". Accordingly, a large amount of data can be transmitted at a high transmission rate even at the same clock frequency, and power consumption can be significantly reduced. The greater the number of bits to be transmitted, the greater the clock signal efficiency in embodiments of the invention. In other words, the clock use efficiency may be as high as $2^n/n$ when n bits of serial data are transferred using the present single wire serial interface.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. An apparatus for transferring serial data, comprising:
   a detector configured to detect a first level time period and a second level time period of an input signal;
   a duty or duty cycle computing unit configured to convert a value of a duty or duty cycle of the input signal into an electric signal;
   a data comparator configured to compare the electric signal with a reference signal and output a binary signal;
   a binary signal storage unit configured to store one or more binary signals, load the one or more binary signals in response to a load signal, and output the one or more binary signals in response to an enable signal; and
   a timer configured to receive the input signal and output the load signal and the enable signal.

2. The apparatus according to claim 1, wherein the duty or duty cycle computing unit computes the duty or duty cycle for each cycle of the input signal.

3. The apparatus according to claim 1, wherein the binary signal storage unit comprises:
   a shift register configured to store the one or more binary signals during a predetermined time period and output the one or more binary signals stored during the predetermined time period in response to a clock signal; and
   a forwarding unit configured to load the one or more binary signals in response to the load signal and output the one or more binary signals as data or as a control signal in response to the enable signal.

4. The apparatus according to claim 3, further comprising:
   a clock generator configured to receive the input signal and output the clock signal.

5. The apparatus according to claim 1, wherein the timer comprises:
   a first timer configured to receive the input signal and output the load signal; and
   a second timer configured to receive the input signal and output the enable signal.

6. The apparatus according to claim 1, wherein the duty or duty cycle represents a ratio of the first level time period to the second level time period.

7. The apparatus according to claim 6, wherein the reference signal has a value between zero (0) and one (1).

8. The apparatus according to claim 7, wherein if the ratio is equal to or greater than the reference signal, the binary signal is zero (0), and if the ratio is less than the reference signal, the binary signal is one (1).

9. The apparatus according to claim 1, wherein when the input signal has a first level for at least a first predetermined time period, the timer generates the load signal.

10. The apparatus according to claim 9, wherein when the input signal has a second level for at least a second predetermined time period, the timer generates an OFF signal for disabling the apparatus.

11. The apparatus according to claim 9, wherein when the input signal has a second level for more than a third predetermined time period, the timer generates the enable signal.

12. A method of transferring serial data, comprising:
   receiving an input signal having a first level and a second level;
   detecting a period of the first level and a period of the second level, respectively;
   generating a binary signal based on a ratio of (i) the period of the first level to (ii) the period of both the first level and the second level, wherein generating the binary signal comprises:
      comparing the ratio with a reference signal having a value between zero (0) and one (1); and
      generating the binary signal of zero (0) if the ratio is equal to or more than the reference signal or the binary signal of one (1) if the ratio is less than the reference signal; and
   outputting the binary signal corresponding to the ratio as data or a control signal when the first level is maintained for at least a first predetermined time period.

13. The method according to claim 12, wherein outputting the binary signal comprises outputting a sequence of binary signals.

14. The method according to claim 12, wherein outputting the binary signal comprises storing the binary signal, loading the binary signal in response to a load signal, and outputting the binary signal in response to an enable signal.

15. The method according to claim 14, wherein the load signal and enable signal are output by a timer configured to receive the input signal.

16. A method of transferring serial data, comprising:
   receiving an input signal having a first level and a second level;
   detecting a period of the first level and a period of the second level, respectively;
   generating a binary signal based on a ratio of (i) the period of the first level to (ii) the period of both the first level and the second level, wherein generating the binary signal comprises:
      comparing the ratio with a reference signal having a value between zero (0) and one (1); and
      generating the binary signal of zero (0) if the ratio is equal to or more than the reference signal or the binary signal of one (1) if the ratio is less than the reference signal; and
   outputting the binary signal corresponding to the ratio as data or a control signal when the first level is maintained for a first predetermined time period and the second level is maintained for a second predetermined time period.

17. The method according to claim 16, wherein outputting the binary signal comprises outputting a sequence of binary signals.

18. The method according to claim 16, wherein outputting the binary signal comprises storing the binary signal, loading the binary signal in response to a load signal, and outputting the binary signal in response to an enable signal.

19. The method according to claim 18, wherein the load signal and enable signal are output by a timer configured to receive the input signal.

* * * * *